(12) United States Patent
Eerden et al.

(10) Patent No.: US 6,503,373 B2
(45) Date of Patent: Jan. 7, 2003

(54) METHOD OF APPLYING A COATING BY PHYSICAL VAPOR DEPOSITION

(75) Inventors: Michael J. J. Eerden, Benningen (NL); David D. Hall, Fishers, IN (US); Gerald F. Hein, Cincinnati, OH (US); Antonius P. Hurkmans, Taylorsville, NC (US); William T. McCarthy, Indianapolis, IN (US); Gerrit Jan van der Kolk, Maarheeze (NL)

(73) Assignees: Ingersoll-Rand Company, Woodcliff Lake, NJ (US); Hauzer Techno Coating Europe BV, Venlo (NL)

( * ) Notice: Subject to any disclaimer, the term of this patent is extended or adjusted under 35 U.S.C. 154(b) by 0 days.

(21) Appl. No.: 09/756,528

(22) Filed: Jan. 8, 2001

(65) Prior Publication Data
US 2001/0053459 A1 Dec. 20, 2001

(30) Foreign Application Priority Data

Jan. 13, 2000 (GB) ............................................... 0000635
Jan. 13, 2000 (GB) ............................................... 0000638

(51) Int. Cl.⁷ .............................................. C23C 16/10
(52) U.S. Cl. ........................... 204/192.12; 204/192.14; 427/250; 427/540
(58) Field of Search ......................... 204/192.1, 192.12, 204/192.14; 427/250, 540

(56) References Cited

U.S. PATENT DOCUMENTS

| 3,968,270 | A |   | 7/1976  | Hasegawa |
| 4,131,530 | A |   | 12/1978 | Blum et al. |
| 4,374,717 | A | * | 2/1983  | Drauglis et al. ........ 204/192.14 |
| 5,525,369 | A | * | 6/1996  | Blackwell et al. ........... 427/250 |
| 6,096,371 | A | * | 8/2000  | Haaland et al. ............. 427/166 |
| 6,143,450 | A | * | 11/2000 | Sobue et al. ................... 430/7 |

FOREIGN PATENT DOCUMENTS

JP          63007365        1/1988

* cited by examiner

Primary Examiner—Bret Chen
(74) Attorney, Agent, or Firm—Michael Best & Friedrich LLP

(57) ABSTRACT

The invention relates to a method of applying a coating by physical vapour deposition onto an article of organic material, in particular of non-conductive organic material such as plastic and/or epoxy material, especially ABS (Acrylonitrile-Butadiene-Styrene Copolymers) and polymers with high temperature resistance, or onto an article of another composition coated with such organic material, wherein a Cr layer is deposited on the article prior to deposition of said coating to form a diffusion barrier for water coming from said article, said Cr layer itself being deposited by a physical vapour deposition process comprising at least the following steps:

a) depositing a first layer of Cr on said article in a physical vapour deposition apparatus using an arc evaporator or cathode sputtering source, or in a combined arc evaporator and cathode sputtering apparatus, using zero bias, and b) subsequently applying a negative bias voltage to said article having said first layer of Cr and depositing a further layer of Cr on said first layer using Cr ions in the same physical vapour deposition apparatus.

24 Claims, 2 Drawing Sheets

Fig. 2  Preliminary process settings:

A
| Cr base layer | | |
|---|---|---|
| Pumping speed | % | 66 |
| Total step time | Min. | 2 |
| Bias voltage | V | 0 |
| Rotation speed | % | 30 |
| Ar partial pressure | Pa | 5.8 E-1 |
| Cathode current | A | 100 (Cr) |

B
| Ion etching | | |
|---|---|---|
| Pumping speed | % | 100 |
| Total step time | Sec | 90 |
| On time cathode | Sec | 30 |
| Off time cathode | Sec | 60 |
| Bias voltage | V | 500 |
| Rotation speed | % | 30 |
| Ar partial pressure | Pa | 1.2 E-1 |
| Cathode current | A | 100 (Cr) |

C
| Cr deposition | | |
|---|---|---|
| Pumping speed | % | 66 |
| Total step time | Min. | 5 |
| Bias voltage | V | 30 |
| Rotation speed | % | 30 |
| Ar partial pressure | Pa | 5.8 E-1 |
| Cathode current | A | 100 (Cr) |

D
| CrN deposition | | |
|---|---|---|
| Pumping speed | % | 66 |
| Total step time | Min. | 5 |
| Bias voltage | V | 30 |
| Rotation speed | % | 30 |
| $N_2$ partial pressure | Pa | 4.0 E-1 |
| Cathode current | A | 100 (Cr) |

E
| CrZrN deposition | | |
|---|---|---|
| Pumping speed | % | 66 |
| Total step time | Min. | 5 |
| Bias voltage | V | 30 |
| Rotation speed | % | 30 |
| $N_2$ partial pressure | Pa | 6.1 E-1 |
| Cathode current | A | 100 (Cr) |
| Cathode current | A | 100 (Zr) |

F
| ZrCN deposition | | |
|---|---|---|
| Pumping speed | % | 66 |
| Total step time | Min. | 5 |
| Bias voltage | V | 50 |
| Rotation speed | % | 30 |
| $N_2$ partial pressure | Pa | 8.3 E-1 |
| $C_2H_2$ partial pressure | Pa | 3.0 E-2 |
| Cathode current | A | 150 (Zr) |

METHOD OF APPLYING A COATING BY PHYSICAL VAPOR DEPOSITION

FIELD OF THE INVENTION

The present invention relates to a method of applying a coating by physical vapour deposition onto an article of organic material, in particular nonconductive organic material such as plastic and/or epoxy material, especially ABS (Acrylonitrile-Butadiene-Styrene Copolymers) and polymers with high temperature resistance, or onto an article of another composition coated with such organic material. Furthermore, the present invention relates to an article of organic material having a coating applied by a physical vapour deposition process.

BACKROUND OF THE INVENTION

It is known to coat plastic articles by physical vapour deposition, for example to produce decorative coatings of specific colours and coatings which are resistant to wear and scratching. Such coated articles may for example be items of architectural hardware, such as door hardware, i.e. handles, finger plates etc., or also elements of taps and other water conducting fittings. Such coating processes have in the past mostly been carried out with an interlayer of nickel.

In addition to the coating of plastic articles by physical vapour deposition, it is also possible to consider providing metal articles with an organic coating, for example alloy wheels with an epoxy coating, with a further coating then being deposited by a physical vapour deposition process.

Besides the non-conductive character, another major problem of applying a coating by physical vapour deposition to plastic/epoxy articles arises in the degassing of the plastic or plastic coating. Water vapour tends to be absorbed in the organic material and cannot be degassed completely by a heat treatment. This means that degassing must be carried out under vacuum environment conditions in the PVD coating apparatus. The degassing requirements significantly restrict the productivity of the PVD apparatus and substantially increase the cost of the process.

SUMMARY OF THE INVENTION

The object of the present invention is to provide a remedy for this problem, so that extensive degassing can be minimized, so that the PVD coating process can be carried out economically and so that long-term problems associated with adsorbed water vapour in the plastic coating are avoided.

In order to satisfy this object, there is provided, in accordance with the present invention, a method of the initially named kind which is characterized in that a Cr layer is deposited on the article prior to deposition of said coating to form a diffusion barrier for water coming from said article, said Cr layer itself being deposited by a physical vapour deposition process comprising at least the following steps:

a) depositing a first layer of Cr on said article in a physical vapour deposition apparatus using an arc evaporator or a cathode sputtering source, or a combined arc evaporator and cathode sputtering apparatus, using zero bias, and b) subsequently applying a negative bias voltage to said article having said first layer of Cr and depositing a second layer of Cr on said first layer using Cr ions in the same physical vapour deposition apparatus, with the negative bias voltage preferably being a moderate bias voltage, e.g. in the range from 10 to 50 V.

Preferably the step a) is followed by a treatment step in the same apparatus in which an elevated negative bias voltage higher than that of step b) and typically in the range from 200 V to 700 V, especially about 500 V is applied to the first Cr layer and said first Cr layer is bombarded with inert gas ions, such as argon, or metal ions generated by the apparatus, typically in the arc evaporation mode. This produces at least one of the following effects:

plasma activation of the free surface of the first Cr layer, etching of the free surface of the first Cr layer, implantation of Cr ions into the first Cr layer implantation of Cr ions into a surface layer of the article beneath said first Cr layer and densification of said first Cr layer.

Thus, according to the present invention, at least one layer of Cr is deposited on the plastic article.

It has namely been found that the Cr layer oxidises in use and in doing so forms a very stable layer which acts as a diffusion barrier for water vapour present in the substrate. Thus, rather than trying to ensure full degassing of the article prior to coating, the present invention proposes an alternative course of action in which water vapour migration from the article is limited by the Cr layer and by the very stable chromium oxide layer which arises.

The chromium oxide layer can arise in different ways. First of all, the conditions in the physical vapour deposition apparatus can lead to some of the oxygen contained in the water adsorbed in the article reacting with the chromium to form chromium oxide. Secondly, the coatings deposited on the Cr layer are still porous to oxygen to some degree, so that oxygen from the atmosphere can penetrate the coating provided on the Cr layer and react with the Cr to form the chromium oxide.

It is a particular advantage of the chromium sealing layer that oxygen does not just react with Cr at the grain boundaries but rather reacts with it over the full surface.

As can be appreciated from the foregoing, the Cr layer is preferably deposited in several steps. Articles consisting of organic materials such as plastics and polymers are typically non-conducting, so that it is not possible to apply a bias voltage to them in an attempt to attract charged chromium ions onto the surface of the article. However, the present invention recognises that it is nevertheless possible to deposit Cr onto such a non-conducting article, or onto an article having a non-conductive surface—such as an epoxy-coated metal wheel—in a physical vapour deposition apparatus, because the conditions prevailing in a physical vapour deposition apparatus during coating means that some of the Cr ions will become neutral, will reach the surface of the article because of kinetic considerations and will be deposited there.

Once a thin layer of Cr has been deposited in this way, the article will have a conductive surface and it is then possible to apply a bias voltage to the article, i.e. to the first Cr layer. The article is held by a metallic fixture and the thin chromium layer deposited on the article forms a bridge to this metallic fixture, so that a bias voltage applied to the metallic fixture is automatically applied to chromium layer on the article by the chromium bridge. This voltage can then be used to promote the attraction of ions so that the article is subjected to ion bombardment. The initial ion bombardment is preferably carried at a relatively high bias voltage, typically in the range from 200 V to 700 V, for example 500 V, in order to ensure adequate ion treatment of the surface.

This ion bombardment has several effects. On the one hand, it produces ion etching of the first layer of Cr, which promotes the bonding of ions subsequently deposited on and coating the surface of the first layer. Secondly, the ion bombardment results in chromium ions being deposited within the first layer and, provided sufficient bias voltage is present, in some chromium ions penetrating the first layer completely and becoming lodged in the surface layer of the article, i.e. in the organic material of the article. These implantation mechanisms promote the adhesion of the chromium layer to the article and also serve to densify the first chromium layer.

Furthermore, even if Cr ions are not implanted into the substrate material during ion bombardment, the plasma present in the physical vapour deposition apparatus serves to activate the substrate surface to promote subsequent coating.

Once the surface of the article has been etched and activated in this manner, chromium ion deposition is continued, but at a more moderate bias voltage of typically 10 to 50 V, especially about 30 V, so that a further layer of Cr is deposited on the surface of the article. The deposition of this further Cr layer at moderate bias results in a denser Cr layer with a better barrier capacity for water and water vapour.

Whereas the first layer of Cr typically has a thickness of up to about 0.1 μm max, the further layer is conveniently executed with a thickness in the range 0.1 μm to 0.4 μm, with 0.2 μm being considered sufficient for most purposes.

Once the total Cr coating has been performed in this way, the actual coating required can be deposited. It is possible to deposit this coating straight onto the further Cr layer, using known physical vapour deposition techniques. It is, however, frequently better to first apply a CrN interface layer to improve the adhesion between the chromium and the top coatings, in particular ceramic top coatings, which are subsequently applied.

Once the CrN interface layer has been deposited, or after deposition of the further Cr layer if no interface layer is provided, the actual desired coating is then deposited on the article, for example to give the required colour and/or abrasion resistance of the surface. Typical coatings are, for example, applied in the form of a stack of coatings comprising alternating layer sequences of various materials. Coatings which are of particular interest comprise coatings selected from the group comprising CrN—CrC, CrN—CrZrN—ZrN and CrN—CrC—ZrCN. However, other coatings may also be applied, such as TiN or TlAlN.

Coatings containing nitrogen are most conveniently deposited by introducing nitrogen into the atmosphere of the physical vapour deposition apparatus. Coatings involving carbon can either be produced from graphite cathodes or by introducing suitable organic gases into the atmosphere of the physical vapour deposition apparatus, such as $C_2H_2$.

Further preferred embodiments of the method and of articles coated in accordance with the method are set forth in the claims appended hereto.

The invention will now be described in more detail with reference to a preferred embodiment and to the accompanying drawings.

DESCRIPTION OF PREFERRED EMBODIMENTS

Figure 1:
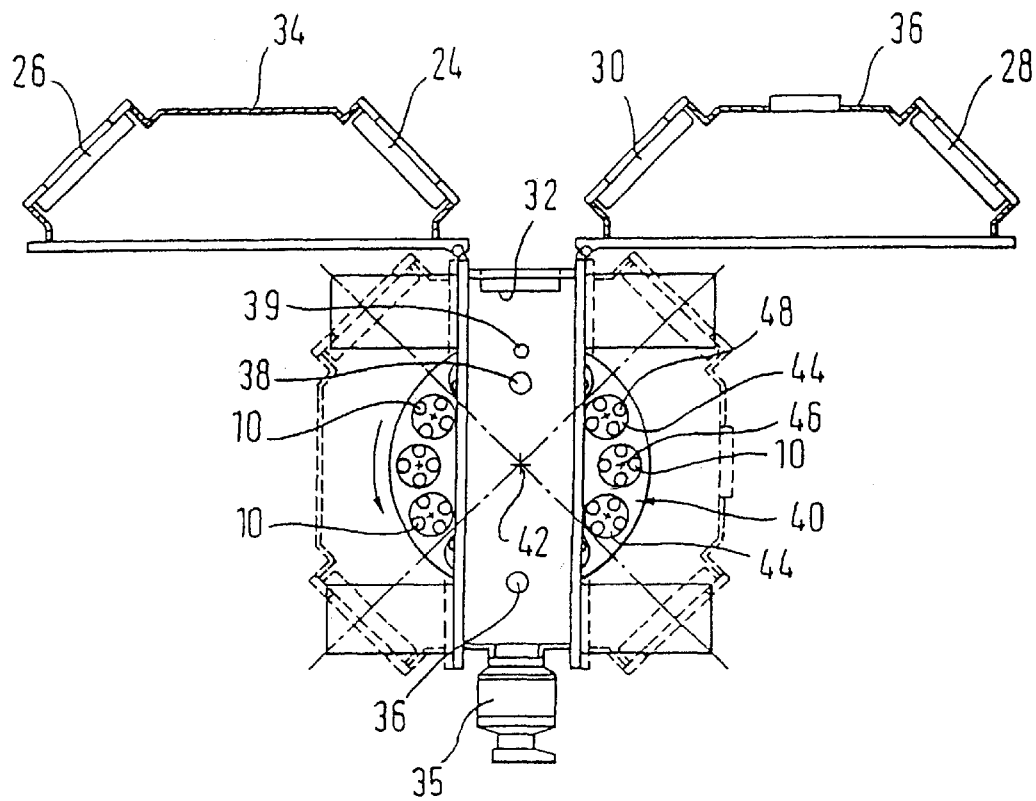
FIG. 1 a coating plant particularly suited to carrying out the method of the invention, and shown in schematic form, FIG. 2 a table listing the method parameters used for applying a coating by physical vapour deposition to articles in the form of items of architectural hardware, and FIG. 3 a schematic diagram of a coating scheme used for articles of architectural hardware and applied using the apparatus of FIG. 1 and the method parameters of table 2.

Turning first to FIG. 1, there can be seen a preferred coating apparatus used for carrying out the method of the invention to produce articles in accordance with the invention. This apparatus is shown in the closed state in broken lines and with the chamber walls or doors open, i.e. unlocked, in solid lines. The apparatus shown here, which is in principle constructed and operated in accordance with the European patent 0 439 561, is particularly described, albeit for another purpose, in "Surface and Coating Technology", Vol. 50 (1992), pages 169 to 178, in an article entitled "A new method for hard coatings" by W. Münz, D. Schultze and F. G. M. Hauzer.

The apparatus shown here employs four targets 24, 26, 28, 30, with the targets 24 and 26 being located in one pivoted chamber wall 34, and the targets 28 and 30 being held in the other pivotable chamber wall 36. The targets 24 and 26 consist of chromium and the targets 28 and 30 consist of zirconium. Each cathode takes the form of a rectangular target which extends with its length axis vertically in relation to the drawing, i.e. perpendicular to the plane of the paper and the targets can be operated either in the arc evaporation discharge mode or as imbalanced magnetrons to carry out the cathode sputtering process. Although it is fundamentally possible using the apparatus shown to change over each target from operation in arc evaporation mode to operation in a cathode sputtering mode, this is not necessary in the present case, since each target only has to be operated in one of the two above mentioned modes, as will be discussed in more detail later.

The reference numeral 35 indicates a turbomolecular pump which serves for the evacuation of the treatment chamber in the closed state, i.e. when the chamber doors are in the broken line position. The reference numeral 36 schematically indicates a supply connection for an inert gas, such as argon, while the supply connection 38 serves for the introduction of nitrogen, which is required in this example. A further supply connection 39 is provided for introducing a carbon-containing organic gas such as acetylene into the treatment chamber.

FIG. 1 moreover shows a substrate carrier 40 which rotates around a central axis 42 and which carries substrate holders 44, which in turn rotate about their axes 46, so that the desired layer formation can take place evenly on the substrates or articles 10 mounted on the substrate holder as the substrates or articles run past the different targets.

The articles 10 can be also be made to rotate around their own axes 48, if this is necessary to achieve appropriately uniform coating. This may be necessary if complex shapes are involved. In some cases it is perfectly sufficient for the substrate carrier 40 to simply rotate about its central axis 42, without other rotations of the substrate holders 44 or of the articles 10 being necessary.

In the present case a plurality of like articles 10, for example circular roses for door handles, are placed on the substrate holders 44 and loaded into the treatment chamber with the doors open. The treatment chamber is then closed by swinging the two doors shut from the position shown in continuous lines in FIG. 1 into the chain-dotted position and locking them in this position. Argon is then introduced via the supply connection 36 into the atmosphere of the chamber, and the chamber is simultaneously evacuated using the high vacuum pumping system 35, so that after a certain time the chamber atmosphere consists at least substantially only of argon at reduced pressure.

During this process or shortly thereafter, the articles 10 are heated using heaters provided inside the chamber (not shown) until the articles have reached a temperature of, for example, slightly over 100° C. Thereafter, the targets 24 and 26 are taken into operation in the arc discharge evaporation mode, but with no bias voltage applied to the articles 50, which is in any event not possible because these consist of a plastic material, i.e. of an organic, non-conductive material such as ABS.

Figure 3:
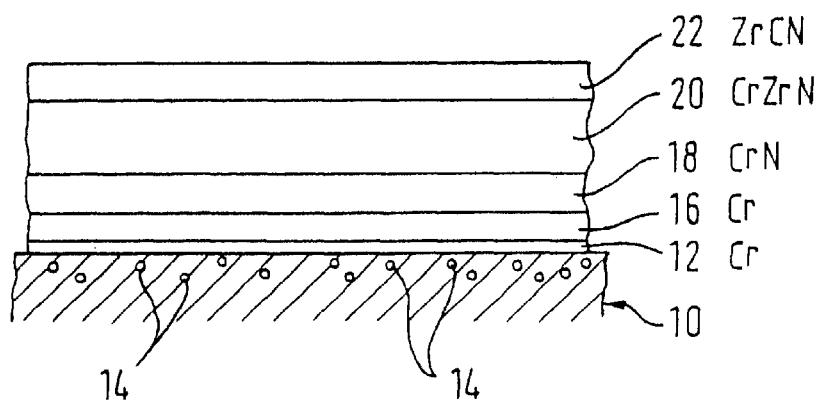

As can be seen from Section A of the table of FIG. 2, the turbomolecular pump is pumping at 66% of its maximum pumping speed, the substrate support 40 is rotating at 30% of its maximum speed, i.e. at about 3 rpm, and the argon flow is selected to achieve an argon partial pressure in Pa of 5.8 E-1 in the treatment chamber. The cathode current at each of the targets 24 and 26 is set to 100 A, and the process runs for a total of a minimum of 2 min, at zero bias voltage. Cr ions produced by the arc discharge at the targets 24 and 26 are present in the plasma within the vacuum chamber and some of them will impinge on the surface of the articles 50. Some of the Cr ions will in particular recombine with electrons and impinge on the surfaces of the articles as neutral atoms or molecules. Thus, during this first stage of the process, some chromium is deposited on the surface of the articles and a first chromium layer 12 (FIG. 3) is formed, typically with a thickness of a maximum of 0.1 $\mu$m. FIG. 3 shows only a section of the surface of the article 10 with the coating in order to clarify the coating scheme.

Once such a layer 12 has been created, the process moves into the step B of table 2. Now a relatively high bias voltage of 500 V is applied to the articles present on the substrate carrier and substrate holders. This is possible because the first Cr layer (52 in FIG. 3) is conductive. The pumping speed of the turbomolecular pump 35 is now increased to its maximum value, the rotational speed of the substrate carrier remains unchanged at 30% of its maximum value and the targets 24 and 26 are operated again in the arc evaporation mode for a total of 90 s, with the cathode being switched off for the first 30 s, and then switched on for a period of 60 s, with the cathode current at each target being set at 100 A. The argon flow into the chamber is reduced so that the argon partial pressure in Pa in the treatment chamber amounts to 1.2 E-1. This, coupled with the high pumping speed of the turbomolecular pump 35, means that any materials outgassing from the articles or dislodged from the articles by the ion bombardment are then extracted via the vacuum system. During this treatment with ion bombardment at the bias voltage of typically 500 V, the surface of the first Cr layer is cleaned and subjected to plasma activation. The energy distribution of the Cr ions in the treatment chamber is such that some Cr ions are deposited within the first Cr layer 52, and indeed some are implanted into the plastic surface of the article, for example at 14. This process densities the first Cr layer and promotes its adhesion to the surface of the article. Because of the high kinetic energy involved, there is relatively little if any net growth of the first Cr 12 layer during this stage.

Following this treatment B, the treatment stage C is commenced. The argon flow is increased again so that an argon partial pressure in Pa of 5.8 E-1 prevails in the treatment chamber, the rotational speed of the substrate carrier 40 is maintained constant at the previous level (3 rpm), and the bias voltage is dropped to a more moderate level of, in this example, 30 V.

The cathode current is again maintained at each of the targets 24 and 26 at 100 A, and the treatment is continued in the arc evaporation mode for a period of a minimum of 5 min. In this mode, further Cr ions strike the surface of the first Cr layer and are deposited there building up a further dense Cr layer 16, typically with a thickness in the range from 0.1 $\mu$m to 0.2 $\mu$m.

Once this process step C has been completed, the barrier layer to prevent water diffusion has now been completed, and the actual coating of the article can start. In this example an interface layer CrN 18 in FIG. 3 is first deposited on the further Cr layer 16 in accordance with step D of the process of FIG. 2.

It will be noted that the settings of the turbomolecular pump and of the speed of rotation of the substrate holder are maintained and that, instead of supplying argon to the process chamber, a flow of $N_2$ is now supplied via the supply connection 38. This flow of $N_2$ is selected such that the partial pressure in Pa of nitrogen in the treatment chamber amounts to 4.0 E-1. The cathode current of each of the targets 24 and 26 is again maintained at 100 A and the target is again operated in the arc evaporation mode. These parameters result in the deposition of a layer of CrN, with the N being supplied from the atmosphere within the chamber of the physical vapour deposition apparatus. This treatment is carried out for a minimum of 5 min. and results in a coating of ca. 0.1 to 0.2 $\mu$m thickness.

Following this, the zirconium targets 28 and 30 are taken into operation in addition to the chromium target. The conditions for this stage of the operation are set forth at Section E of the table of FIG. 2. It will be noted that the pumping speed and the speed of rotation are maintained as before, that the bias voltage is maintained at 30 V and that the flow of $N_2$ is increased so that the partial pressure in Pa of nitrogen in the treatment chamber amounts to 6.1 E-1. The cathode current at each. of the targets 24, 26, 28 and 30 is set at 100 A.

This process stage is also carried out for a minimum of 5 min. and results in the deposition of a CrZrN layer 20 of about 0.2 $\mu$m to 0.4 $\mu$m thickness.

Once this layer has been deposited, the process enters the final stage F in this example. The aim now is to deposit a layer 22 of ZrCN onto the article. In this method step F the pumping speed and the rotational speed are kept constant, the bias voltage is increased to 50 V and deposition is effected using the Zr targets 28 and 30 only. The cathode current at each of the Zr targets is increased to 150 A. The nitrogen flow, necessary to supply nitrogen to the atmosphere of the chamber is increased so that the nitrogen partial pressure in Pa amounts to 8.3 E-1. A carbon containing gas in the form of $C_2H_2$ is added via the further supply connection 39 into the chamber atmosphere at a rate sufficient to produce a partial pressure there in Pa of 3.0 E-2. The treatment is carried out for a minimum period of a further 5 min. and results in the deposition of the desired layer 22 of ZrCN of typically 0.1 to 0.2 $\mu$m thickness. The Zr target is operated here in the arc evaporation mode.

Once the ZrCrN layer has been completed, the articles 14 have been provided with the required coating and can be removed from the apparatus. They now typically have a golden colour, given by the coating materials selected.

Various modifications of this process are possible.

First of all, rather than depositing just a single layer of CrZrN and a single layer of ZrCN, a plurality of alternating layers of CrZrN and ZrCN can be deposited, by alternatively switching between the process steps E and F, which are then operated for a shorter period of time for each layer of the coating; e.g., for 1 minute per layer.

Secondly, it is possible to deposit the coatings in the steps E and F by operating the targets in the cathode sputtering mode. This is done by adjusting the process conditions to values suitable for operation as an imbalanced magnetron. Suitable values are given in the above mentioned document EP-A-0 439 561.

Moreover, it is not necessary for the coatings of steps E and F to be both deposited by the arc deposition mode or both by the cathode sputtering mode, one coating can be applied by the one method and the other coating by the other method.

It should also be mentioned that the coating quoted here is simply one coating by way of example, other coatings known per se can readily be used. The important consideration is the provision of the Cr layer to act as a water diffusion barrier. If another material is used in the coating scheme then target 30 can be formed of this other metal.

Other physical vapour deposition processes can also be used to deposit either the first Cr layer or the second Cr layer as required.

Finally, it should be mentioned that experiments have been conducted with the coating quoted above and with a similar coating having a top layer of CrC to test the corrosion resistance.

After 1000 hours neutral salt spray test, no failure of PVD coating in contact with the substrate or of the substrate itself has been observed.

In UV testing no failures have been observed.

Having described the invention, what is claimed is:

1. A method of applying a coating by physical vapour deposition onto an article of organic material, or onto an article of another composition coated with such organic material,
characterised in that
   a Cr layer is deposited on the article prior to deposition of said coating to form a diffusion barrier for water coming from said article, said Cr layer itself being deposited by a physical vapour deposition process comprising at least the following steps:
   a) depositing a first layer of Cr on said article in a physical vapour deposition apparatus using an arc evaporator or cathode sputtering source, or a combined arc evaporator and cathode sputtering source, using zero bias, and
   b) subsequently applying a negative bias voltage to said article having said first layer of Cr and depositing a further layer of Cr on said first layer using Cr ions in the same physical vapour deposition apparatus,
      wherein the step a) is followed by a treatment step in the same apparatus in which a negative bias higher than that of step b) is applied to said first Cr layer and said first Cr layer is bombarded with Cr ions to produce at least one of the following effects:
         plasma activation of the free surface of the first Cr layer
         etching of the free surface of the first Cr layer,
         implantation of Cr ions into the first Cr layer
         implantation of Cr ions into a surface layer of the article beneath said firs Cr layer
         densification of said first Cr layer.

2. A method in accordance with claim 1, wherein said article comprises non-conductive organic material.

3. A method in accordance with claim 1, wherein said organic material comprises plastic and/or epoxy material.

4. A method in accordance with claim 1, wherein said organic material comprises ABS (acrylonitrile butadiene styrene copolymers).

5. A method in accordance with claim 1, wherein said negative bias voltage of step b) lies in the range from 10 V to 50 V and is typically 30 V.

6. A method in accordance with claim 1 wherein the thickness of said first Cr layer lies in the range up to a maximum of 0.1 $\mu$m.

7. A method in accordance with claim 1 wherein the thickness of said further Cr layer lies in the range from 0.1 $\mu$m to 0.4 $\mu$m.

8. A method in accordance with claim 1, wherein, said treatment at a higher bias voltage and the deposition of said further layer takes place using arc evaporation, which is also used the deposition of the first said layer.

9. A method in accordance with claim 1, wherein an interface layer of CrN to improve adhesion between the Cr layers and said coating is deposited on said further layer by introducing nitrogen into the physical vapour deposition apparatus and using an arc evaporation process and/or a cathode sputtering process.

10. A method in accordance with claim 9, wherein a transition in composition is made on changing from the deposition of said interface layer of CrN to said coating or to the first layer thereof.

11. A method in accordance with claim 10, wherein said transition is effected by reducing the flow rate of nitrogen into the treatment chamber and/or by reducing the percentage of Cr in the interface layer during layer growth while simultaneously increasing the proportion of one or more elements of the layer following the interface layer.

12. A method in accordance with claim 1, wherein said coating comprises a stack of coating layers selected, selected from the group comprising CrN—CrC, CrN—CrZrN—CrN and CrN—CrC—ZrCN, said stack of coatings being applied in the same physical vapour deposition apparatus as said Cr layer using arc evaporation and/or magnetron sputtering with cathodes of Cr, Zr and optionally also of graphite and with the addition of nitrogen or carbon-containing gases to the atmosphere of said physical vapour deposition apparatus.

13. A method of applying a coating by physical vapour deposition onto an article of organic material, or onto an article of another composition coated with such organic material,
characterised in that
   a Cr layer is deposited on the article prior to deposition of said coating to form a diffusion barrier for water coming from said article, said Cr layer itself being deposited by a physical vapour deposition process comprising at least the following steps:
   a) depositing a first layer of Cr on said article in a physical vapour deposition apparatus using an arc evaporator or cathode sputtering source, or a combined arc evaporator and cathode sputtering source, using zero bias, and
   b) subsequently applying a negative bias voltage to said article having said first layer of Cr and depositing a further layer of Cr on said first layer using Cr ions in the same physical vapour deposition apparatus,
      wherein the step a) is followed by a treatment step in the same apparatus in which a negative bias higher than that of step b) is applied to said first Cr layer and said first Cr layer is bombarded with Cr ions to produce at least one of the following effects:
         plasma activation of the free surface of the first Cr layer
         etching of the free surface of the first Cr layer,
         implantation of Cr ions into the first Cr layer
         implantation of Cr ions into a surface layer of the article beneath said firs Cr layer
         densification of said first Cr layer, wherein said higher negative bias voltage lies in the range from 200 V to 700 V and is approximately 500 V.

14. A method in accordance with claim 13, wherein said article comprises non-conductive organic material.

15. A method in accordance with claim 13, wherein said organic material comprises plastic and/or epoxy material.

16. A method in accordance with claim 13, wherein said organic material comprises ABS (acrylonitrile butadiene styrene copolymers).

17. A method in accordance with claim 13, wherein said negative bias voltage of step b) lies in the range from 10 V to 50 V and is typically 30 V.

18. A method in accordance with claim 13, wherein the thickness of said first Cr layer lies in the range up to a maximum of 0.1 μm.

19. A method in accordance with claim 13, wherein the thickness of said further Cr layer lies in the range from 0.1 μm to 0.4 μm.

20. A method in accordance with claim 13, wherein, said treatment at a higher bias voltage and the deposition of said further layer takes place using arc evaporation, which is also used the deposition of the first said layer.

21. A method in accordance with claim 13, wherein an interface layer of CrN to improve adhesion between the Cr layers and said coating is deposited on said further layer by introducing nitrogen into the physical vapour deposition apparatus and using an arc evaporation process and/or a cathode sputtering process.

22. A method in accordance with claim 21, wherein a transition in composition is made on changing from the deposition of said interface layer of CrN to said coating or to the first layer thereof.

23. A method in accordance with claim 22, wherein said transition is effected by reducing the flow rate of nitrogen into the treatment chamber and/or by reducing the percentage of Cr in the interface layer during layer growth while simultaneously increasing the proportion of one or more elements of the layer following the interface layer.

24. A method in accordance with claim 13, wherein said coating comprises a stack of coating layers selected, selected from the group comprising CrN—Crc, CrN—CrZrN—CrN and CrN—CrC—ZrCN, said stack of coatings being applied in the same physical vapour deposition apparatus as said Cr layer using arc evaporation and/or magnetron sputtering with cathodes of Cr, Zr and optionally also of graphite and with the addition of nitrogen or carbon-containing gases to the atmosphere of said physical vapour deposition apparatus.

* * * * *

UNITED STATES PATENT AND TRADEMARK OFFICE
CERTIFICATE OF CORRECTION

PATENT NO.    : 6,503,373 B2
DATED         : January 7, 2003
INVENTOR(S)   : Michel J. J. Eerden et al.

It is certified that error appears in the above-identified patent and that said Letters Patent is hereby corrected as shown below:

Title page,
Item [54], Title, "METHOD OF APPLYING A COATING BY PHYSICAL VAPOR DEPOSITION" should read -- METHOD OF APPLYING A COATING BY PHYSICAL VAPOUR DEPOSITION --

Column 10,
Line 15, "from the group comprising CrN-Crc, CrN-CrZrN-CrN and CrN" should read -- from the group comprising CrN-CrC, CrN-CrZrN-CrN and CrN --

Signed and Sealed this

Seventeenth Day of June, 2003

JAMES E. ROGAN
*Director of the United States Patent and Trademark Office*